United States Patent
Cao et al.

(10) Patent No.: US 10,971,898 B2
(45) Date of Patent: *Apr. 6, 2021

(54) LASER RADAR

(71) Applicant: Shenzhen Genorivision Technology Co., Ltd., Shenzhen (CN)

(72) Inventors: Peiyan Cao, Shenzhen (CN); Yurun Liu, Shenzhen (CN)

(73) Assignee: Shenzhen Genorivision Technology Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/813,869

(22) Filed: Mar. 10, 2020

(65) Prior Publication Data
US 2020/0212654 A1 Jul. 2, 2020

Related U.S. Application Data

(63) Continuation of application No. 16/185,488, filed on Nov. 9, 2018, now Pat. No. 10,630,054, which is a (Continued)

(51) Int. Cl.
*H01S 5/42* (2006.01)
*H01S 5/183* (2006.01)
(Continued)

(52) U.S. Cl.
CPC ........ *H01S 5/18325* (2013.01); *G01S 7/4815* (2013.01); *G01S 7/4816* (2013.01); *G01S 17/08* (2013.01); *H01S 5/02252* (2013.01); *H01S 5/1838* (2013.01); *H01S 5/18363* (2013.01); *H01S 5/18377* (2013.01);
(Continued)

(58) Field of Classification Search
CPC .. H01S 5/18325; H01S 5/02252; H01S 5/423; H01S 5/18363; H01S 5/18377; H01S 5/1838; H01S 5/426; H01S 5/0224; H01S 5/0226; H01S 5/0215; H01S 5/005; G01S 17/08; G01S 7/4816; G01S 7/4815
See application file for complete search history.

(56) References Cited

U.S. PATENT DOCUMENTS 9,798,087 B1 * 10/2017 Mathai .................. G02B 6/4269
10,630,054 B2 * 4/2020 Cao ...................... H01S 5/18363
(Continued)

OTHER PUBLICATIONS

Moench Holger et al., VCSEL-based sensors for distance and velocity, Proceedings of SPIE; vol. 9766, Mar. 4, 2016, pp. 97660A-97660A, XP060066637, DOI: 10.1117/12.2209320.

*Primary Examiner* — Xinning(Tom) Niu
(74) *Attorney, Agent, or Firm* — IPro, PLLC

(57) ABSTRACT

Disclosed herein is a system comprising: an optical system with a focal plane; an apparatus at the focal plane; a filter; wherein the apparatus comprises an array of vertical-cavity surface-emitting lasers (VCSELs) on a first substrate and an array of detectors on a second substrate, the detectors configured to detect laser beams that are emitted by the VCSELs and backscattered by an object; wherein the first substrate is mounted to the second substrate and is configured to allow the laser beams that are emitted by the VCSELs and backscattered by the object to transmit through the first substrate and reach the detectors; wherein the filter is configured to prevent light other than the laser beams from passing.

19 Claims, 5 Drawing Sheets

Related U.S. Application Data continuation of application No. PCT/CN2017/072151, filed on Jan. 23, 2017.

(51) Int. Cl.
    *G01S 17/08*     (2006.01)
    *H01S 5/022*     (2021.01)
    *G01S 7/481*     (2006.01)
    *H01S 5/02*     (2006.01)
    *H01S 5/00*     (2006.01)

(52) U.S. Cl.
    CPC .............. *H01S 5/423* (2013.01); *H01S 5/426* (2013.01); *H01S 5/005* (2013.01); *H01S 5/0215* (2013.01); *H01S 5/0224* (2013.01); *H01S 5/0226* (2013.01)

(56) References Cited

U.S. PATENT DOCUMENTS

2003/0016614 A1 *   1/2003   Vo-Dinh ................ G11C 13/04
                                                    369/112.15
2007/0181810 A1     8/2007   Tan et al.
2010/0187449 A1     7/2010   Schemmann et al.

* cited by examiner

LASER RADAR

TECHNICAL FIELD

The disclosure herein relates to a laser radar and more particularly to a laser radar comprising vertical-cavity surface-emitting lasers and detectors.

BACKGROUND

A laser radar (also called LIDAR, LiDAR and LADAR) is a device that measures distance to a target by illuminating that target with a laser (e.g., ultraviolet, visible, or near infrared). A laser radar may be used to image objects, which may include a wide range of materials, including non-metallic objects, rocks, rain, chemical compounds, aerosols, clouds and even single molecules.

A laser radar may include a laser (e.g., a laser with a wavelength between 500 nm and 1600 nm). The laser may be pulsed or continuous. A laser radar may include a mechanism that scans and controls the laser. The mechanism may scan the laser mechanically (e.g., oscillating plane mirrors, polygon mirrors) or electronically (e.g., phased array). A laser radar may also have a detector configured to detect light reflected by the objects being imaged.

The vertical-cavity surface-emitting laser (VCSEL), is a type of semiconductor laser diode with laser beam emission perpendicular from the top surface, contrary to conventional edge-emitting semiconductor lasers (also in-plane lasers) which emit from surfaces formed by cleaving the individual chip out of a wafer. A VCSEL may have an active region sandwiched between upper and lower Bragg reflectors (e.g., formed by epitaxial growth on a substrate). A VCSEL may be formed from materials such as GaAs, InGaAs, or AlGaAs.

SUMMARY

Disclosed herein is an apparatus, comprising: an array of vertical-cavity surface-emitting lasers (VCSELs) on a first substrate; an array of detectors on a second substrate, the detectors configured to detect laser beams emitted by the VCSELs and backscattered by an object; wherein the first substrate is mounted to the second substrate and is configured to allow the laser beams emitted by the VCSELs and backscattered by the object to transmit through the first substrate and reach the detectors.

According to an embodiment, the detectors comprise single photon avalanche diodes or a photomultiplier.

According to an embodiment, the first substrate comprises GaAs.

According to an embodiment, the apparatus further comprises circuitry configured to drive the VCSELs and the detectors.

According to an embodiment, the circuitry is integrated on the second substrate.

According to an embodiment, the first substrate and the second substrate are bonded such that the VCSELs are electrically connected to the circuitry.

According to an embodiment, the first substrate comprises vias and at least some of electric contacts of the VCSELs are electrically connected to the circuitry by the vias.

According to an embodiment, vias are through an entire thickness of the first substrate.

According to an embodiment, the first substrate comprises windows configured to allow the laser beams emitted by the VCSELs and backscattered by the object to transmit through the windows and reach the detectors.

Disclosed herein is a system comprising an optical system with a focal plane and any of the above apparatuses disposed at the focal plane.

Disclosed herein is a method comprising: forming an array of vertical-cavity surface-emitting lasers (VCSELs) on a first substrate; forming an array of detectors on a second substrate, the detectors configured to detect laser beams emitted by the VCSELs and backscattered by an object; mounting the first substrate to the second substrate; wherein the first substrate is configured to allow the laser beams emitted by the VCSELs and backscattered by the object to transmit through the first substrate and reach the detectors.

According to an embodiment, the detectors comprise single photon avalanche diodes.

According to an embodiment, the first substrate comprises GaAs.

According to an embodiment, the method further comprises forming circuitry configured to drive the VCSELs and the detectors on the first substrate or the second substrate.

According to an embodiment, mounting the first substrate to the second substrate comprises flip chip bonding or direct bonding.

According to an embodiment, the method further comprises forming vias in the first substrate, the vias configured to provide electrical connection between the first and second substrates.

According to an embodiment, forming the vias comprises etching the first substrate.

According to an embodiment, the method further comprises forming windows configured to allow the laser beams emitted by the VCSELs and backscattered by the object to transmit through the windows and reach the detectors.

According to an embodiment, forming the windows comprises etching the first substrate.

DETAILED DESCRIPTION

Figure 1A:
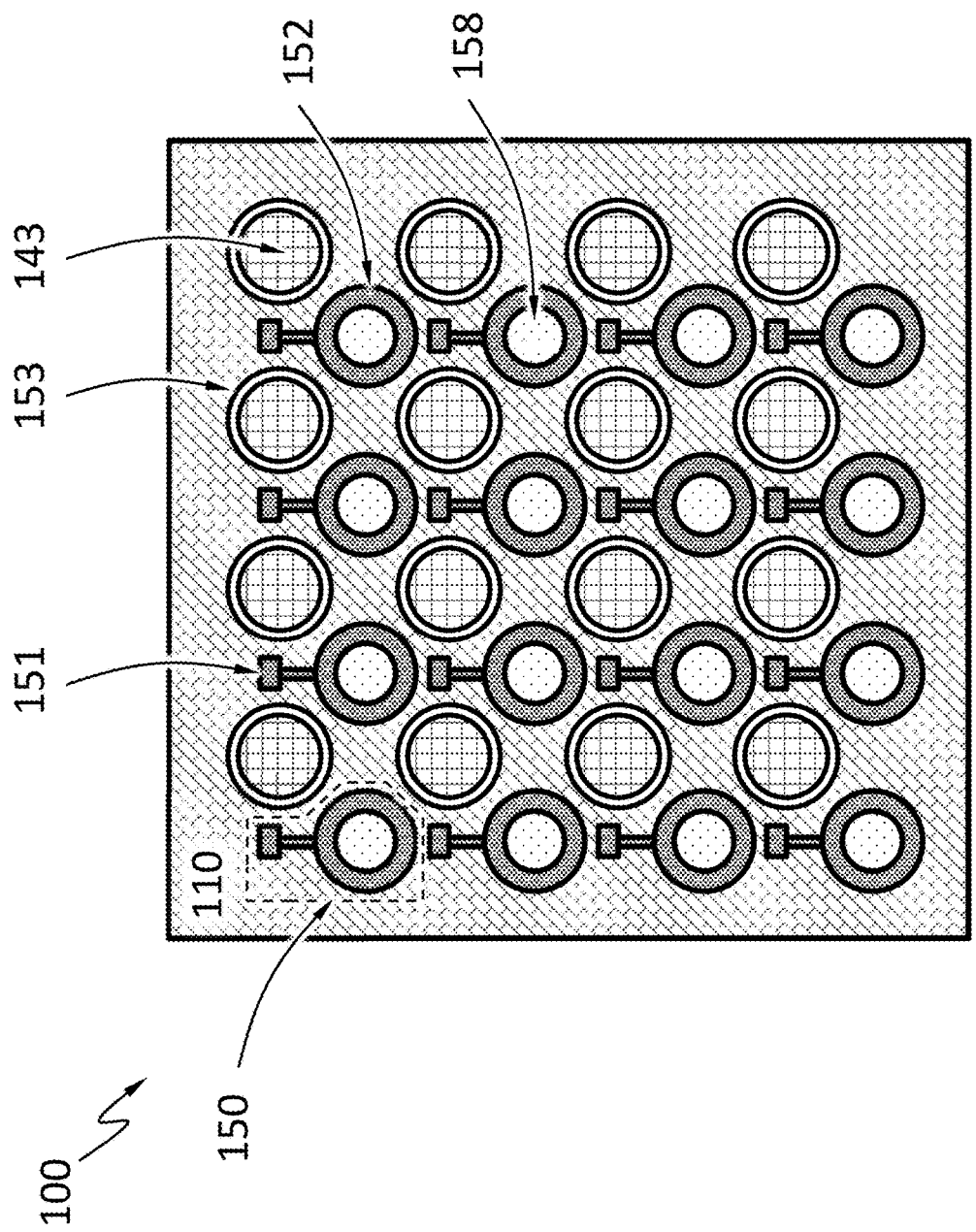
FIG. 1A and FIG. 1B schematically show an apparatus, according to an embodiment.
Figure 1B:
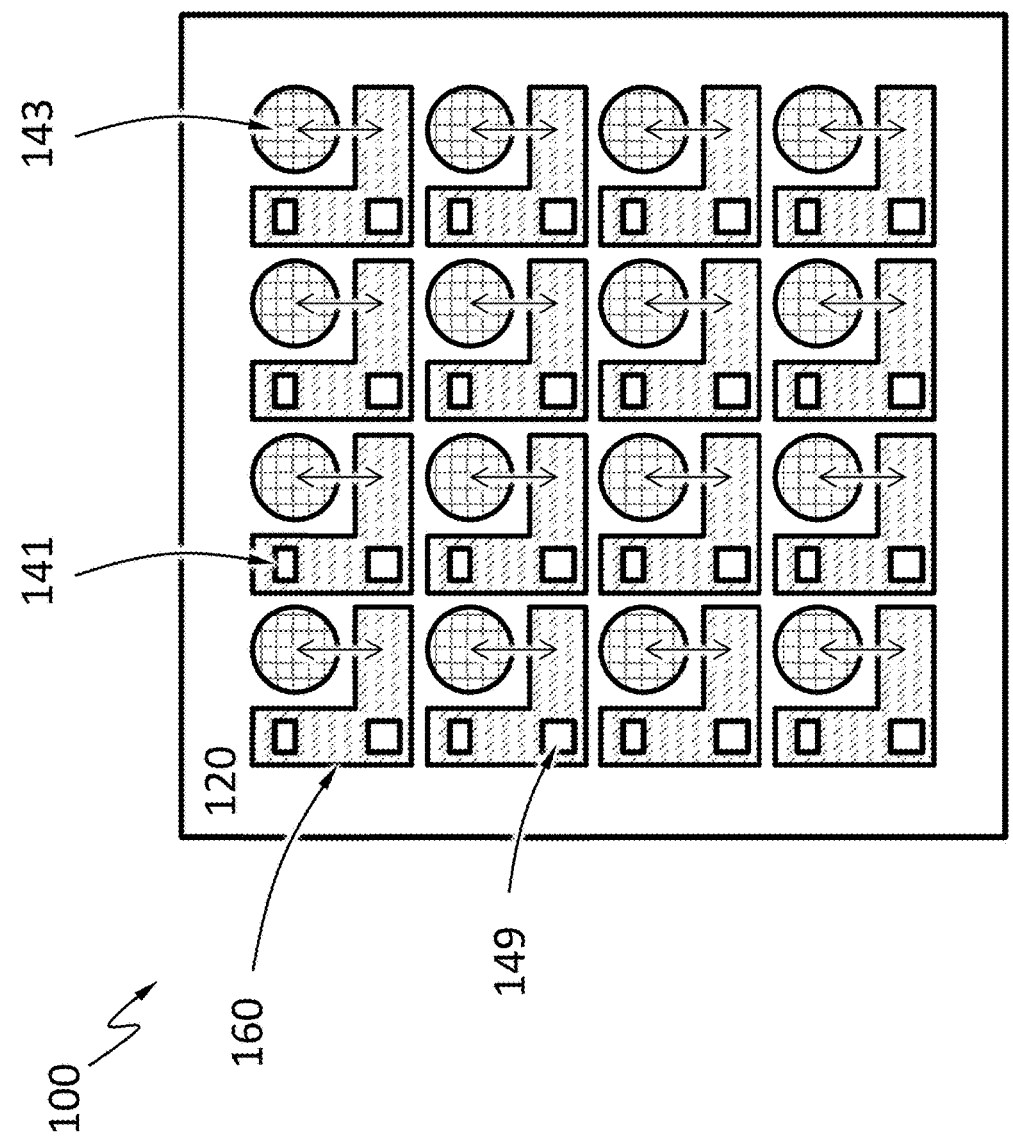

FIG. 1A and FIG. 1B schematically show an apparatus 100, according to an embodiment. The apparatus 100 comprises a first substrate 110 and a second substrate 120. The first substrate 110 may comprise GaAs. The second substrate 120 may comprise silicon. As shown in FIG. 1A, the first substrate 110 comprises an array of VCSELs 150. The VCSEL 150 has a first electric contact 152 and a second electric contact 155 (not shown here but shown in FIG. 2). The first electric contact 152 and the second electric contact 155 are configured to power the VCSEL 150. The VCSEL 150 has an aperture 158, from which laser may be emitted. The first electric contact 152 may be position to surround the aperture 158. The VCSEL 150 may have a via 151 through the entire thickness of the first substrate 110, for electrical connect to the second substrate 120. The via 151 and the first electric contact 152 are electrically connected. The first substrate 110 may have a plurality of windows 153 positioned to allow the laser beams emitted by the VCSELs 150 and backscattered by an object to transmit through the first substrate 110 and reach detectors on the substrate 120. The windows 153 may simply be void space or may be a material that is not opaque to the laser beams from the VCSELs 150. In an embodiment, the first substrate 110 itself may be not opaque to the laser beam from the VCSELs 150 and the windows 153 may be omitted. For example, GaAs is not opaque to light with a wavelength from about 900 nm to about 18 µm. In another example, a wavelength converter is used with the apparatus 100 to convert the laser emitted by VCSELs 150 into a laser with a wavelength to which the first substrate 110 is not opaque.

As shown in FIG. 1B, the second substrate 120 has an array of detectors 143, configured to detect laser beams emitted by the VCSELs 150 and backscattered by an object. The first substrate 110 is mounted to the second substrate 120. The detectors 143 are positioned such that the laser beams emitted by the VCSELs 150 and backscattered by an object can transmit through the windows 153 of the first substrate 110 and reach the detectors 143.

The second substrate 120 can be a printed circuit board (PCB), a silicon substrate or any other suitable form. In the case that the second substrate 120 is a PCB, the detectors 143 and the circuitry 160 may be chips mounted on or embedded in the PCB. In the case that the second substrate 120 is a silicon substrate, the detectors 143 and the circuitry 160 may be formed by a CMOS process.

The apparatus 100 may have circuitry 160 configured to drive the VCSELs 150 and the detectors 143. For example, the circuitry 160 may be integrated on the second substrate 120. The first substrate 110 may be bonded to the second substrate 120 such that the VCSELs 150 are electrically connected to the circuitry 160. The circuitry 160 may have an electric contact 141 that electrically connects to the via 151. The circuitry 160 may have an electric contact 149 that electrically connects to the second electric contact 155 of the VCSELs 150. The circuitry 160 may be configured to control the detectors 143, or process or interpret signals from the detectors 143.

The electrical connection between VCSELs 150 and the circuitry 160 may be made by ways. One example is wire bonding. Another example is by conductive adhesive (e.g., benzocyclobuene (BCB)).

Figure 2:
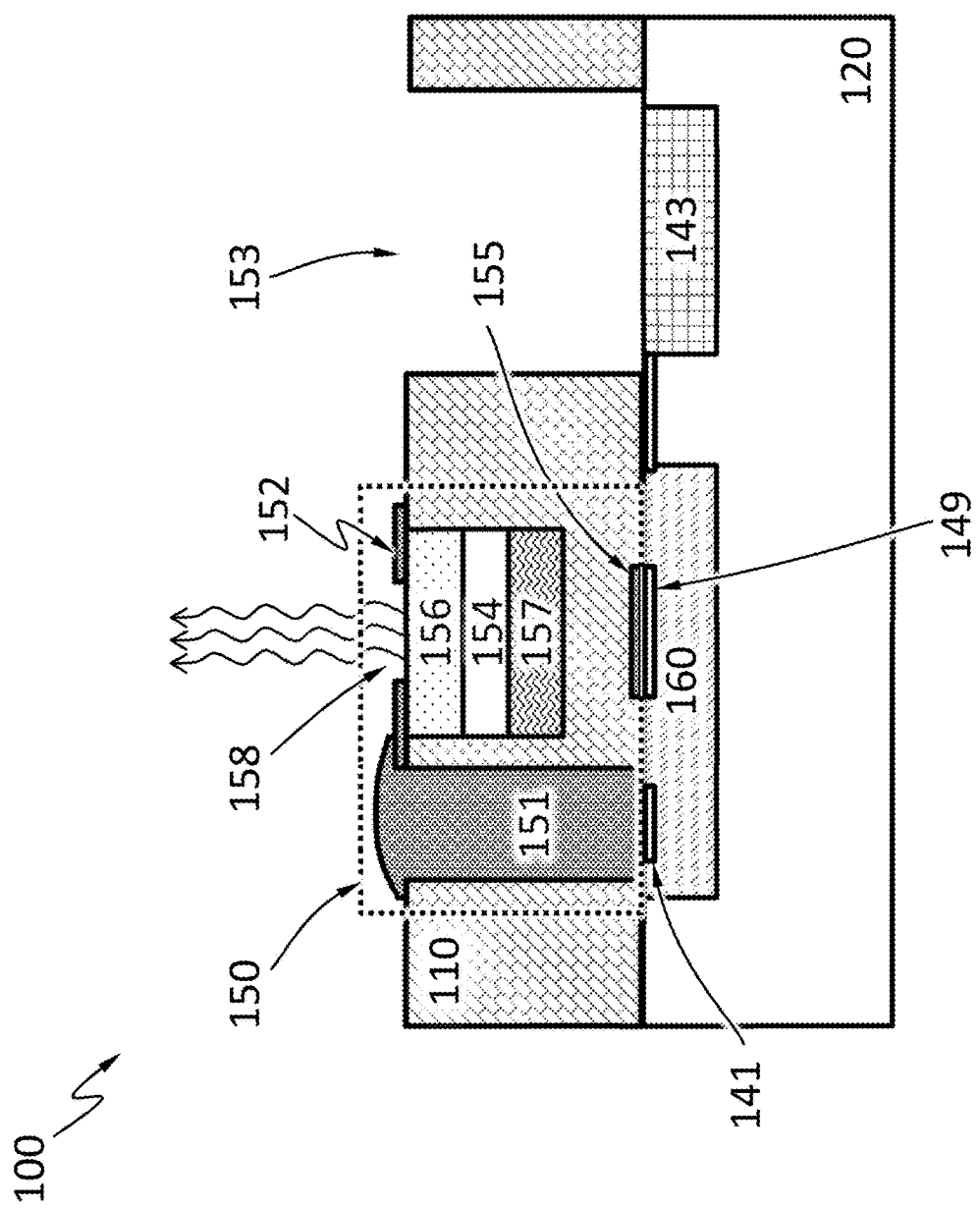
FIG. 2 schematically shows a cross-sectional view of the apparatus of FIG. 1A and FIG. 1B, according to an embodiment.

FIG. 2 schematically shows a cross-sectional view of an apparatus 100, according to an embodiment. In this example, the VCSEL 150 may comprise an active layer 154, which may include a quantum well, sandwiched between an upper Bragg reflector 156 and a lower Bragg reflector 157. The upper Bragg reflector 156, the active layer 154 and the lower Bragg reflector 157 may be epitaxially formed on the first substrate 110.

The detectors 143 may be any suitable detectors. In an example, the detectors 143 include photomultipliers. A photomultiplier is able to multiply the current produced by incident light by many times, and thus allowing detection of low incident flux of photons. A photomultiplier may be in a form of a vacuum phototube that includes a housing containing a photocathode, several dynodes and an electron collector. Light entering the housing and incident on the photocathode causes electrons to be emitted by the photocathode, as a consequence of the photoelectric effect. The electrons impinge on the successive dynodes, causing electron multiplication by secondary emission. After impingement on the last dynode, the electrons are collected by the collector and used for detection of the incident light.

In an example, the detectors 143 include single photon avalanche diode (SPAD) (also known as a Geiger-mode APD or G-APD). A SPAD is an avalanche photodiode (APD) working under a reverse bias above the breakdown voltage. Here the word "above" means that absolute value of the reverse bias is greater than the absolute value of the breakdown voltage. When a photon incidents on a SPAD, it may generate charge carriers (electrons and holes). Some of the charge carriers are accelerated by an electric field in the SPAD and may trigger an avalanche current by impact ionization. Impact ionization is a process in a material by which one energetic charge carrier can lose energy by the creation of other charge carriers. For example, in semiconductors, an electron (or hole) with enough kinetic energy can knock a bound electron out of its bound state (in the valence band) and promote it to a state in the conduction band, creating an electron-hole pair. A SPAD may be used to detect low intensity light (e.g., down to a single photon) and to signal the arrival times of the photons with a jitter of a few tens of picoseconds. A SPAD may be in a form of a p-n junction under a reverse bias (i.e., the p-type region of the p-n junction is biased at a lower electric potential than the n-type region) above the breakdown voltage of the p-n junction. The breakdown voltage of a p-n junction is a reverse bias, above which exponential increase in the electric current in the p-n junction occurs.

Figure 3:
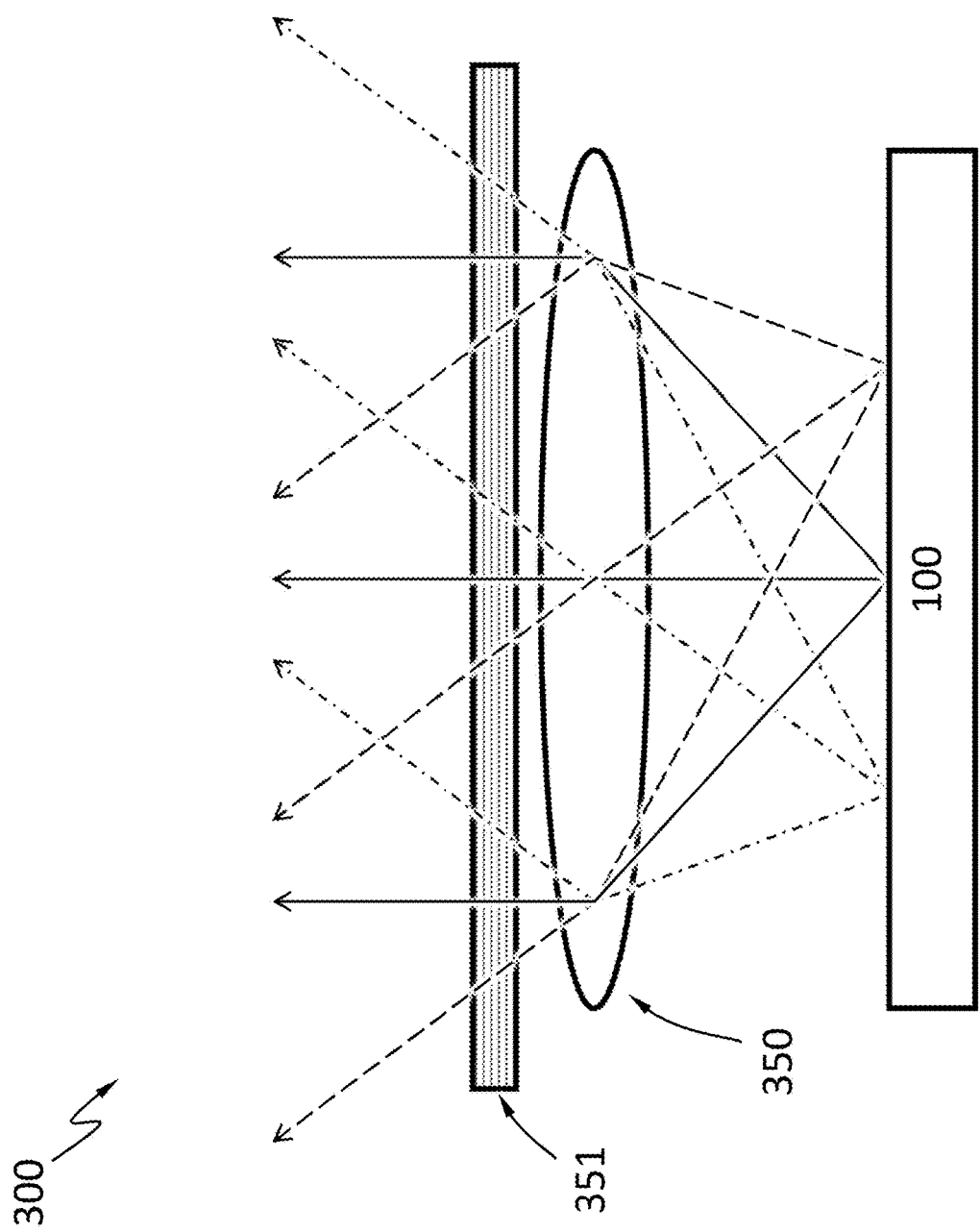
FIG. 3 schematically shows a system comprising an optical system and the apparatus of the apparatus of FIG. 1A and FIG. 1B positioned at a focal plane of the optical system.

FIG. 3 schematically shows a system 300 comprising an optical system 350 and the apparatus 100 positioned at a focal plane of the optical system 300. The system 300 may be a laser radar, a telescope or a camera. The system 300 may have a filter 351 that prevents light other than the laser beam from passing. The filter 351 may be integrated into the apparatus 100, for example, in front of the detectors 143. The filter 351 may be part of the windows 153. In operation, the laser beams emitted by the VCSELs 150 of the apparatus 100 are directed to different directions toward a scene far away from the apparatus 100 (i.e., the distance from the scene to the apparatus 100 being much greater than the VCSELs 150 and their respective neighboring detectors 143). A laser beam emitted by one of the VCSELs 150 and backscattered by an object in the scene is collected by the detector 143 neighboring that the VCSEL. The distance of the object to the apparatus 100 is determined based on, for example, the phase difference between the emitted and the backscattered laser beam, or based on the time-of-flight of the laser beam. Although the optical system 300 is shown as a single convex lens in FIG. 3, the optical system 300 can have any suitable components. The VCSELs 150 may be configured such that all VCSELs 150 emit laser beams at the same time, or at different time. For example, the VCSELs 150 may be configured to emit laser beams one by one (i.e., only one of the VCSELs 150 is powered at a given time); the VCSELs 150 may be configured such that some of the VCSELs 150 are powered at a given time, where these powered VCSELs 150 are spaced apart. Not all of the VCSELs 150 emitting at the same time may help reducing crosstalk among the detectors 143.

Figure 4:
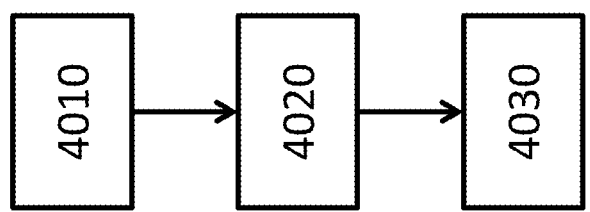
FIG. 4 schematically shows a flowchart for a method of making the apparatus of FIG. 1A and FIG. 1B, according to an embodiment.

FIG. 4 schematically shows a flowchart for a method of making the apparatus 100, according to an embodiment. In procedure 4010, an array of VCSELs is formed on a first substrate. In procedure 4020, an array of detectors is formed on a second substrate. The detectors are configured to detect laser beams emitted by the VCSELs and backscattered by an object. In procedure 4030, the first substrate is mounted to the second substrate. The substrate is configured to allow the laser beams emitted by the VCSELs and backscattered by the object to transmit through the first substrate and reach the detectors. In procedure 4010, vias may also be formed (e.g., by etching) in the first substrate. The vias are configured to provide electrical connection between the first and second substrates. In procedure 4010, windows may also be formed (e.g., by etching) in the first substrate and the windows are configured to allow the laser beams emitted by the VCSELs and backscattered by the object to transmit through the windows and reach the detectors.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system comprising:
 an optical system with a focal plane;
 an apparatus at the focal plane;
 a filter;
 wherein the apparatus comprises an array of vertical-cavity surface-emitting lasers (VCSELs) on a first substrate and an array of detectors on a second substrate, the detectors configured to detect laser beams that are emitted by the VCSELs and backscattered by an object;
 wherein the first substrate is mounted to the second substrate and is configured to allow the laser beams that are emitted by the VCSELs and backscattered by the object to transmit through the first substrate and reach the detectors;
 wherein the filter is configured to prevent light other than the laser beams from passing.

2. The system of claim 1, wherein the system is a laser radar, a telescope or a camera.

3. The system of claim 1, wherein the detectors comprise single photon avalanche diodes or a photomultiplier.

4. The system of claim 1, wherein the first substrate comprises GaAs.

5. The system of claim 1, wherein the apparatus further comprises circuitry configured to drive the VCSELs and the detectors.

6. The system of claim 5, wherein the circuitry is integrated on the second substrate.

7. The system of claim 6, wherein the first substrate and the second substrate are bonded such that the VCSELs are electrically connected to the circuitry.

8. The system of claim 7, wherein the first substrate comprises vias and at least some of electric contacts of the VCSELs are electrically connected to the circuitry by the vias.

9. The system of claim 8, wherein vias are through an entire thickness of the first substrate.

10. The system of claim 1, wherein the first substrate comprises windows configured to allow the laser beams emitted by the VCSELs and backscattered by the object to transmit through the windows and reach the detectors.

11. The system of claim 10, wherein the filter is a part of the windows.

12. A method comprising:
 emitting laser beams from an array of vertical-cavity surface-emitting lasers (VCSELs) on a first substrate;
 receiving the laser beams that are backscattered by an object, through the first substrate using an array of detectors on a second substrate;
 wherein the first substrate is mounted to the second substrate.

13. The method of claim 12, further comprising collimating the laser beams before the laser beams are backscattered by the object.

14. The method of claim 12, further comprising focusing the laser beams onto the detectors after the laser beams are backscattered by the object.

15. The method of claim 12, wherein the detectors comprise single photon avalanche diodes.

16. The method of claim 12, wherein the first substrate comprises GaAs.

17. The method of claim 12, wherein the first substrate or the second substrate comprises circuitry configured to drive the VCSELs and the detectors.

18. The method of claim 12, wherein receiving the laser beams that are backscattered by the object comprises allowing the laser beams to transmit through windows of the first substrate.

19. The method of claim 12, further comprising preventing light other than the laser beams from reaching the detectors.

* * * * *